United States Patent
Kim et al.

(10) Patent No.: US 10,340,156 B2
(45) Date of Patent: Jul. 2, 2019

(54) HEAT RELEASING SEMICONDUCTOR CHIP PACKAGE AND METHOD FOR MANUFACTURING THE SAME

(71) Applicant: Magnachip Semiconductor, Ltd., Cheongju-si (KR)

(72) Inventors: Jo Han Kim, Cheongju-si (KR); Hee Jin Park, Gumi-si (KR); Kyeong Su Kim, Seoul (KR); Jae Jin Lee, Gumi-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/587,205

(22) Filed: Dec. 31, 2014

(65) Prior Publication Data

US 2015/0371924 A1    Dec. 24, 2015

(30) Foreign Application Priority Data

Jun. 24, 2014   (KR) .................. 10-2014-0077400

(51) Int. Cl.
  *H01L 21/56*    (2006.01)
  *H01L 23/373*   (2006.01)
  (Continued)

(52) U.S. Cl.
  CPC ........ *H01L 21/563* (2013.01); *H01L 21/4882* (2013.01); *H01L 23/3737* (2013.01);
  (Continued)

(58) Field of Classification Search
  CPC ............... H01L 23/42; H01L 21/563; H01L 2224/16225; H01L 2224/32225; H01L 2224/73204; H01L 2224/92125
  See application file for complete search history.

(56) References Cited

U.S. PATENT DOCUMENTS

| | | | |
|---|---|---|---|
| 6,258,626 B1 * | 7/2001 | Wang | ................ H01L 24/11 257/777 |
| 6,387,728 B1 * | 5/2002 | Pai | ................ H01L 25/0657 257/E21.705 |

(Continued)

FOREIGN PATENT DOCUMENTS

| | | |
|---|---|---|
| CN | 101205349 A | 6/2008 |
| JP | 2009-105366 A | 5/2009 |

(Continued)

OTHER PUBLICATIONS

Korean Office Action dated Oct. 2, 2015 in counterpart Korean Patent Application No. 10-2014-0077400. (5 pages in Korean).

(Continued)

*Primary Examiner* — Peter Bradford
(74) *Attorney, Agent, or Firm* — NSIP Law

(57) ABSTRACT

A method for manufacturing a heat releasing semiconductor chip package includes attaching a first surface of a semiconductor chip onto an insulating film, injecting a coating liquid onto a second surface of the semiconductor chip to form a liquefied coating layer and curing the liquefied coating layer to form a heat releasing layer. The coating liquid includes a liquefied molding compound for heat releasing and fine alumina particles. Therefore, the heat releasing semiconductor chip package and method for manufacturing the semiconductor chip package form a heat releasing layer in direct contact with the semiconductor chip to maximize a heat releasing effect.

12 Claims, 5 Drawing Sheets

(51) Int. Cl.
*H01L 23/433* (2006.01)
*H01L 21/48* (2006.01)

(52) U.S. Cl.
CPC .............................. *H01L 23/4334* (2013.01); *H01L 2224/16225* (2013.01); *H01L 2224/32225* (2013.01); *H01L 2224/73204* (2013.01); *H01L 2224/92125* (2013.01)

(56) References Cited

U.S. PATENT DOCUMENTS

| | | | |
|---|---|---|---|
| 8,508,056 B2 | 8/2013 | Kim et al. | |
| 2002/0000296 A1* | 1/2002 | Terada | H01L 27/322 156/295 |
| 2005/0170188 A1* | 8/2005 | Campbell | C08G 59/24 428/413 |
| 2005/0228097 A1* | 10/2005 | Zhong | B82Y 30/00 524/430 |
| 2006/0275952 A1* | 12/2006 | Gowda | H01L 21/4871 438/122 |
| 2009/0047797 A1* | 2/2009 | Anderson | H01L 23/3135 438/763 |
| 2009/0283599 A1* | 11/2009 | Okamoto | G01N 22/04 235/439 |
| 2010/0140800 A1* | 6/2010 | Hagihara | H01L 21/563 257/737 |
| 2010/0314637 A1* | 12/2010 | Kim | H05K 7/20963 257/88 |
| 2011/0233756 A1* | 9/2011 | Khandekar | H01L 23/3737 257/712 |
| 2013/0193612 A1* | 8/2013 | Watabe | H01L 21/563 264/261 |
| 2014/0159223 A1* | 6/2014 | Chen | H01L 21/563 257/690 |

FOREIGN PATENT DOCUMENTS

| | | |
|---|---|---|
| JP | 4863690 B2 | 1/2012 |
| KR | 1998-064955 A | 10/1998 |
| KR | 10-2000-0056801 | 9/2000 |
| KR | 10-2010-0135161 A | 12/2010 |

OTHER PUBLICATIONS

Chinese Office Action dated Mar. 27, 2019 in counterpart Chinese Patent Application No. 201510212043.0 (11 pages in Chinese).

* cited by examiner

HEAT RELEASING SEMICONDUCTOR CHIP PACKAGE AND METHOD FOR MANUFACTURING THE SAME

CROSS-REFERENCE TO RELATED APPLICATIONS

This application claims the benefit under 35 USC § 119(a) of Korean Patent Application No. 10-2014-0077400 filed on Jun. 24, 2014, in the Korean Intellectual Property Office, the entire disclosure of which is incorporated herein by reference for all purposes.

BACKGROUND

1. Field

The following description relates to a heat releasing semiconductor chip packaging technology. The following description also relates to a low-cost semiconductor chip package and method for manufacturing the same using a liquefied coating liquid.

2. Description of Related Art

An apparatus including a liquid crystal display, such as a notebook, a tablet PC, or a smart phone, uses a highly integrated transistor for implementing a high-resolution display. The highly integrated transistor uses technologies applied for reducing a generated heat because the highly integrated transistor generates a high heat when driving the liquid crystal display. At the present time, such a heating problem of key transistor chips being used in an Organic Light-Emitting Diode (OLED) TV or an Ultra High Density (UHD) LED TV is presenting design issues for these types of display technologies. Additionally, the larger a size of the display screen is above sizes such as 50 inches, the more issues the heating problems may present.

For example, a UHD LED TV generates more heat than existing full-HD resolution TV displays because a horizontal value and a vertical value of a resolution are increased to require processing more than double as many pixels for a given display frame and hence a processing speed for image data of such a device must be faster than double the speed of exiting technologies.

Thus, a malfunction, such as displaying no picture or displaying snow on a screen, may occur because a TV overheats by heat releasing from an internal component. For example, this heat releasing may occur within a display driver Integrated Circuit (IC), where the display drive IC controls a color and a picture quality of the UHD LED TV panel to generate the screen display. Therefore, an approach for implementing a heat releasing effect for releasing a heat of the display drive IC is being implemented. A technology of including a heat releasing layer on the display driver IC using an insulating tape to release excess heat accounts for most traditional technologies. However, a method of forming the heat releasing layer using the insulating tape is not well-adapted to an apparatus such as the UHD LED TV discussed above that generates a high heat. Also, manufacturing costs increase because the insulating tape for adding the heat releasing layer is also used, incurring costs.

Certain technologies relate to a heat releasing structure of a semiconductor package, in which a heat releasing element may be installed in the semiconductor package to release an internal heat to the outside.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples provide a semiconductor chip package and method for manufacturing the same that is capable of being manufactured through a simple manufacturing process and an inexpensive manufacturing cost.

Examples provide a semiconductor chip package and method for manufacturing the same that are capable of forming a heat releasing layer in direct contact with the semiconductor chip.

Examples provide the semiconductor chip package and method for manufacturing the same that are capable of forming the heat releasing layer in direct contact with the semiconductor chip to provide stability of electronic products using a highly integrated circuit.

In one general aspect, a method for manufacturing a heat releasing semiconductor chip package includes attaching a first surface of a semiconductor chip onto an insulating film, injecting a coating liquid onto a second surface of the semiconductor chip to form a liquefied coating layer, and curing the liquefied coating layer to form a heat releasing layer, wherein the coating liquid comprises a liquefied molding compound for heat releasing and fine alumina particles.

Curing the coating layer may include performing a pre-curing and performing a post-curing.

Attaching the first surface of the semiconductor chip onto the insulating film may further include filling an epoxy molding compound into a space between the insulating film and the semiconductor chip.

Filling the epoxy molding compound may further include comprises performing a pre-curing for curing the epoxy molding compound and performing a post-curing for curing the epoxy molding compound.

Performing the post-curing may include curing the liquefied coating layer or the epoxy molding compound at a temperature of 100° C.-200° C.

Performing the post-curing may include curing the liquefied coating layer at a temperature of 100° C.-200° C.

A viscosity of the coating liquid may be 10,000 cP-300,000 cP.

A thermal conductivity of the coating liquid may be 1.0 W/mK-4.0 W/mK.

The molding compound for heat releasing may be a silicon-based molding compound or an epoxy-based molding compound.

The fine alumina particles may constitute 60%-90% of the coating liquid.

A size of the fine alumina particles may be 3 μm-70 μm.

An area of the heat releasing layer is 5 mm-10 mm by 10 mm-40 mm and a thickness of the heat releasing layer is to 0.5-3.0 mm.

In another general aspect, a heat releasing semiconductor chip package includes a first surface of a semiconductor chip attached onto an insulating film, a coating liquid injected onto a second surface of the semiconductor chip to form a liquefied coating layer, and a heat releasing layer, formed by curing the liquefied coating layer, wherein the coating liquid includes a liquefied molding compound for heat releasing and fine alumina particles.

Curing the coating layer may include performing a pre-curing and performing a post-curing.

Attaching the first surface of the semiconductor chip onto the insulating film may further include filling an epoxy molding compound into a space between the insulating film and the semiconductor chip.

Filling an epoxy molding compound may further include performing a pre-curing for curing the epoxy molding compound and performing a post-curing for curing the epoxy molding compound.

Performing the post-curing may include curing the liquefied coating layer or the epoxy molding compound at a temperature of 100° C.-200° C.

Performing the post-curing may include curing the liquefied coating layer at a temperature of 100° C.-200° C.

The molding compound for heat releasing may be a silicon-based molding compound or an epoxy-based molding compound.

An area of the heat releasing layer may be 5 mm-10 mm by 10 mm-40 mm and a thickness of the heat releasing layer is 0.5-3.0 mm.

The described technology has certain advantages. However, this does not require that a specific example will always include all the following advantages or is limited to including the following advantages.

The heat releasing semiconductor chip package and method for manufacturing the heat releasing semiconductor chip package, according to an example, forms a heat releasing layer in direct contact with the semiconductor chip to maximize a heat releasing effect.

The heat releasing semiconductor chip package and method for manufacturing the heat releasing semiconductor chip package, according to an example, forms the heat releasing layer in direct contact with the semiconductor chip to decrease manufacturing costs.

The heat releasing semiconductor chip package and method for manufacturing the heat releasing semiconductor chip package according to an example forms the heat releasing layer in directly contact with the semiconductor chip to provide stability for electronic products using the highly integrated circuit.

Other features and aspects will be apparent from the following detailed description, the drawings, and the claims.

Figure 1:
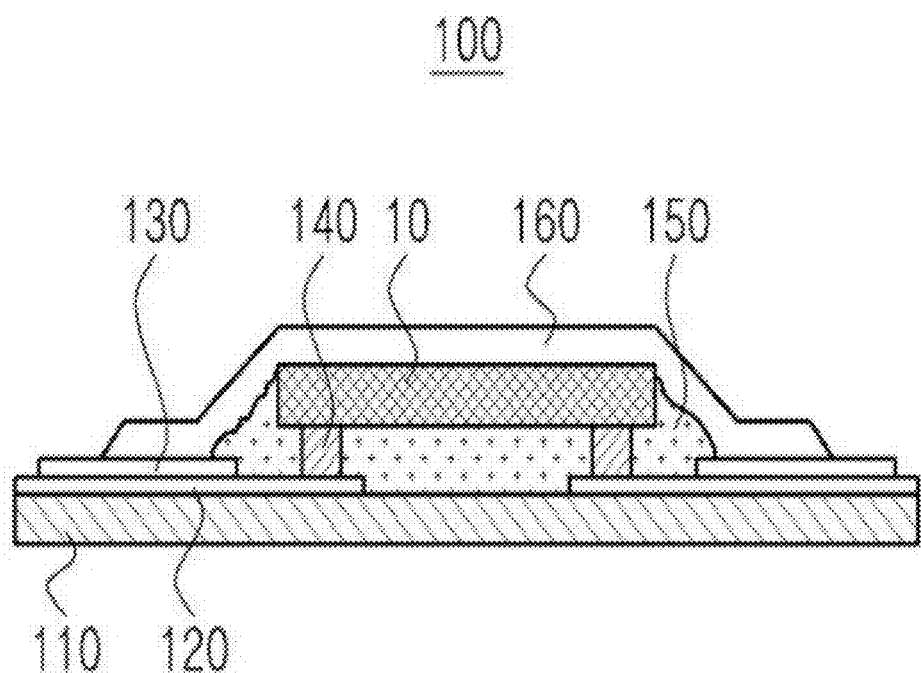
FIG. 1 is a side view diagram illustrating a heat releasing semiconductor chip package, according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms described in the present disclosure are to be understood as follows.

While terms such as "first" and "second," etc., may be used to describe various components, such components are not to be understood as being limited to the above terms. The above terms are used only to distinguish one component from another. For example, a first component may be referred to as a second component without departing from the scope of rights of the present disclosure, and likewise a second component may be referred to as a first component.

It is to be understood that when an element is referred to as being "coupled to" another element, the element may be directly coupled to the other element or intervening elements may also be present. In contrast, when an element is referred to as being "directly coupled to" another element, no intervening elements are present. Also, unless explicitly described to the contrary, the word "comprise" and variations such as "comprises" or "comprising," are to be understood to imply the inclusion of stated elements but not the exclusion of any other elements. Meanwhile, other expressions describing relationships between components such as "-between", "immediately-between" or "adjacent to-" and "directly adjacent to-" are to be construed similarly.

Singular forms, such as "a", "an" and "the," in the present disclosure are intended to include the plural forms as well, unless the context clearly indicates otherwise. It is to be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added in examples.

The terms used in the present application are merely used to describe various examples, and are not intended to limit the present disclosure. Unless otherwise defined, all terms used herein, including technical or scientific terms, have the same meanings as those generally understood by those with ordinary knowledge in the field of art to which the present disclosure belongs in view of the present disclosure. Such terms as those defined in a generally used dictionary are to be interpreted to have the meanings equal to the contextual meanings in the relevant field of art, and are not to be interpreted to have ideal or excessively formal meanings unless clearly defined in the present disclosure.

FIG. 1 is a side view diagram illustrating a heat releasing semiconductor chip package according to an example.

Referring to FIG. 1, a heat releasing semiconductor chip package 100 includes a semiconductor chip 10, an insulating film 110, a metal pattern 120, a solder resist 130, a plurality of bumps 140, an epoxy molding compound 150 and a heat releasing layer 160. In one example, the heat releasing layer 160 is defined to refer to a coating layer 160 corresponding to a time order of a manufacturing process, and is referred to as a heat releasing layer 160 or a coating layer 160 depending on which stage of the manufacturing process is relevant.

The semiconductor chip 10 includes first and second surfaces and the second surface corresponds to an opposite side with respect to the first surface. The first surface is coupled to the insulating film 110 and, in an example the second surface is in direct contact with the heat releasing layer. The semiconductor chip 10 is situated on the plurality of bumps 140 and, in an example, is electrically coupled to the metal pattern 120 through the plurality of bumps 140. For example, the semiconductor chip 10 is bonded to the plurality of bumps 140 using a heat of a bucking apparatus to be combined together, where a bucking apparatus is a type of reinforcing device that aids in the bonding process. In one example, the semiconductor chip 10 corresponds to a gate driver, that is, a data source, used to a display device. However, the semiconductor chip 10 is not to be limited to being a gate driver.

In examples, the insulating film 110 corresponds to a base used for integrating a semiconductor, for example, a package film used in a Chip on Flexible Printed Circuit (COF) structure, a Tape Carrier Package (TCP structure, or a Chip on Board (COB structure. In such examples, the insulating film 110 is possibly formed of a polyimide material. Also, in such examples, one side of the insulating film 110 is coupled to a panel Anisotropic Conductive Film (ACF) terminal, not illustrated, and another side is coupled to a display device board, not illustrated. That is, in such examples, the semiconductor chip 10, the panel ACF terminal, not illustrated, and the display device board, not illustrated, are electrically coupled on the insulating film 110 through the metal pattern 120.

In an example, the metal pattern 120 is deposited as a conductive material on the insulating film 110 as a part of a signal line of the semiconductor chip 10 being formed. Therefore, the metal pattern 120 deposited by the conductive material is electrically coupled to the semiconductor chip 10 through the plurality of bumps 140. As a result, the metal pattern 120 supports a signal transmission by the semiconductor chip 10, allowing communication between the metal pattern 120 and the semiconductor chip.

For example, the solder resist 130 is patterned in a semiconductor chip receiving area on the metal pattern 120. The semiconductor chip receiving area is generated by removing a part of the deposited metal pattern 120. That is, the solder resist 130 is patterned on the metal pattern 120 to protect the metal pattern 120 formed by the conductive material. For example, the solder resist 130 electrically insulates a space between the semiconductor chip and other parts. Also, in this example, the metal pattern 120 is removed by an etching process using a photo etching process, such as photochemical machining.

For example, the plurality of bumps 140 are formed in the solder resist 130 on the metal pattern 120. In such an example, the plurality of bumps 140 is coupled to the metal pattern 120 and electrically couple the semiconductor chip 10 to the metal pattern 120.

For example, the plurality of bumps 140 are coupled to the metal pattern 120 by removing an inside portion of the solder resist 130 to expose the metal pattern 120 and bonding the plurality of bumps 140 to the exposed metal pattern 120.

In this example, the plurality of bumps 140 are respectively formed on the metal pattern 120 deposited on the insulating films 110 so as to be electrically coupled to the metal pattern 120 without leading to the disappearance of signals from the semiconductor chip 10.

Likewise, the epoxy molding compound 150 is underfilled to the semiconductor chip 10 for preventing the semiconductor chip 10 from having problems with issues such as thermal strain. For example, an underfill process potentially includes introducing the epoxy molding compound 150 along edge of the semiconductor chip 10 and allowing the liquid to flow to fill gaps. Also, in an example, the epoxy molding compound 150 is underfilled for covering the metal pattern 120 and simultaneously controlling how the metal pattern 120 is exposed for coupling the plurality of bumps 140 to the semiconductor chip 10. In one example, the epoxy molding compound 150 fills the inside of the solder resist 130 so that at least a portion of both sides of the semiconductor chip 10 is included. Thus, the epoxy molding compound 150 is formed by using the insulating material to insulate an inside area of the plurality of bumps 140.

The heat releasing layer 160 is formed so that the heat releasing layer 160 directly contacts the semiconductor chip 10. For example, the heat releasing layer 160 is formed by curing a coating liquid, where the coating liquid is formed by mixing a liquefied heat releasing molding compound and fine alumina particles. For example, the coating liquid includes the liquefied heat releasing molding compound and the fine alumina particles. In one example, the heat releasing molding compound corresponds to one of a silicon-based liquefied molding compound or an epoxy-based liquefied molding compound.

A silicon-based heat releasing molding compound refers to a compound in which a liquefied silica $SiO_2$ colloid is mixed with water to spread throughout the water as an aqueous solution state. A colloid is a substance in which microscopically dispersed insoluble particles are suspended throughout another substance.

As described, the silicon-based heat releasing molding compound potentially includes a silicone rubber, a silicone resin, a condensation catalyst, a solvent and a curing catalyst and the condensation catalyst. With respect to these components of the compound, the solvent and the curing catalyst are components that are present in examples. However, the silicone rubber and the silicone resin are selectively used in various examples.

The silicon resin, or an alternative silicon molding compound, has excellent electrical insulating properties and available as being adapted to a wide range of temperatures. Also, the silicon resin has less frequency dependence and includes a small carbonization component because the silicon resin has a small amount of polarity. For example, the silicon resin is formed of silicon with a maximized cross-linking density. Herein, the cross-linking means that strands of a linear high-weight molecule, such as various types of polymers, are chemically combined to form a molecule having a three-dimensional network structure. When the high-weight molecule proceeds to cross-link, while an elasticity decreases, a hardness of the resulting substance is increased because degrees of freedom of the molecule decreases due to the cross-links.

The silicon resin discussed above has better curing properties than a silicon oil or the silicon rubber, in that the silicon resin forms a strong film and molding compound when being cured. As one example, the silicon resin corresponds to a polymer having a siloxane structure Si—O—Si. The silicon resin includes, for example, a functional group and organic functional groups. The functional group of the silicon resin corresponds for example, to a hydroxyl group (—OH) or a methoxy group (—OCH$_3$) and the organic functional groups of the silicon resin (i.e. —R), correspond, for example, to one or more of a methyl group (—CH$_3$) and a phenyl group (—C$_6$H$_5$).

In an example, the silicon rubber forms a helicoidal structure as a high polymer molecule having a long chain form. The silicon rubber has a small intermolecular mutual attraction, so that an elasticity property of the silicon rubber is high. The silicon rubber is used as an insulating material because the silicon rubber has excellent insulating property. However, in some examples, the silicon rubber includes materials such as carbon, silver, nickel and a metal oxide as a filler to be used for implementing a silicon rubber that has conductivity. When the silicon rubber is exposed to air for a long time, the silicon rubber undergoes a cross-linking reaction with moisture to form a rubber elastic body. For example, such a rubber elastic body is used as an elastic adhesive or an elastic coating. The liquefied silicon rubber is potentially separated into a main constituent and a curing agent to be stored. The main body and the curing agent are then mixed to be cured by moisture of a mixture and air just before being used.

In examples, a epoxy-based heat releasing molding compound corresponds to the epoxy molding compound 150. The epoxy molding compound 150 refers to a compound having an epoxy structure and the epoxy structure refers to a structure having oxygen between other atoms. That is, the epoxy molding compound 150 corresponds to a chemical unit of a molecule including an epoxy structure, as defined above. In example, the epoxy molding compound 150 is formed by polymerizing an epichlorohydrin and a bisphenol A. The epoxy molding compound 150 has a light molecular weight, so that the epoxy molding compound 150 is implemented as an oligomer having a monomer and the monomer has a lighter molecular weight than a high-weight molecule. The epoxy molding compound 150 thus forms a strong molecule having a three-dimensional network structure when the epoxy molding compound 150 is at an ambient temperature and is heated by using a curing agent. For example, potential curing agents include amines, an acid anhydride, a metallic salt and a lewis acid. That is, the epoxy molding compound 150 is not independently cured, unlike other thermosetting molding compounds. The epoxy molding compound 150 uses subsidiary materials for satisfying a purpose of use, a usage condition, and a condition when curing is achieved by mixing the epoxy molding compound 150 and the curing agent. The purpose of using subsidiary materials is to denature the epoxy molding compound 150 itself so that the epoxy molding compound 150 is able to satisfy usage conditions working conditions and to give a property to a cured molding compound. Because one of these effects is sometimes satisfied while another effect is not satisfied, the subsidiary materials are to be carefully selected so that both effects may be satisfied. For example, the subsidiary materials are classified as the curing agent, a diluent, the filler and other additives for managing the occurrence of these effects. Herein, when the curing agent is used to select the subsidiary materials, a curing temperature and a curing time are considered. The epoxy molding compound 150 has a much lower reaction shrinkage rate and much better mechanical properties and electric insulating properties than a polyester molding compound, a phenol molding compound, an urea molding compound and a melamine molding compound and do not generate a volatile material as a waste product. Also, the epoxy molding compound 150 has excellent chemical resistance due to an excellent water resistance and an excellent resistance to other chemical agents. However, because the epoxy molding compound 150 is very vulnerable to ultraviolet rays and easily discolors when it is exposed to light, the epoxy molding compound 150 is mainly used in indoor applications. The epoxy molding compound 150 has excellent electrical-mechanical properties for a curing material. The epoxy molding compound 150 also performs a precise molding because a weight change rate is low when it is being cured. The epoxy molding compound 150 has also has excellent durability characteristics because it is not twisted and transformed after curing. The epoxy molding compound 150 has strong resistance to stress change after curing and also has excellent heat resistance, chemical resistance, water resistance, and wear resistance, as discussed above. The epoxy molding compound 150 is not cured when it is not actively mixed with a curing agent, so it is stored in a state of not being mixed with a main agent and the curing agent, that is, stored separately. In an example, the epoxy molding compound 150 is used with an appropriate coloring agent by mixture so that it is implemented to have various colors.

For example, the fine alumina particles increase thermal conductivity to reduce a time that is needed to reach a curing heat of the coating liquid and to maintain viscosity of the coating liquid at an ambient temperature. In one example, a size of the fine alumina particles corresponds to 3 μm-70 μm. In another example, a size of the fine alumina particles is formed in the range of 0.2 μm-0.5 μm for increasing the heat conductivity so that become smaller. In another example, a fine powder is used in the liquefied heat releasing molding compound because it is relatively easily sintered and the fine powder is assumed to consist of fine alumina particles having an average size being below 1 μm. Sintering refers to a process of forming a solid mass of material by a combination of heat and/or pressure without liquefying the material.

For example, the viscosity of the coating liquid is controlled according to a rate corresponding to the heat releasing molding compound and the fine alumina particles. In one example, the proper viscosity of the coating liquid corresponds to a range 10,000-300,000 cP. Herein, 1 cP is a centipoise, and corresponds to $\frac{1}{1000}$ Pa-Sec. In such an example, the coating liquid maintains a constant viscosity so that it does not spread throughout the water when injecting. The coating liquid also uses a fluidity of certain level so that it properly controls a diffusion length. The fluidity of the coating liquid changes according to the viscosity as it is the reciprocal of viscosity and in an example the proper fluidity length range of the coating liquid corresponds to a range of 54 mm-60 mm.

When the fine alumina particles are mixed with the heat releasing molding compound, the heat releasing molding compound function as the insulating material and the fine alumina particles function as the filler. The filler may be mixed with the heat releasing molding compound to release an internal heat of the heat releasing molding compound to the outside of the compound. That is, the fine alumina particles are dispersed in the heat releasing molding compound so that the heat is released and the heat releasing molding compound then corresponds to the strong high-weight molecular form of a three-dimensional network structure.

In one example, a portion of the liquefied heat releasing molding compound included in the coating liquid corresponds to 10%-40% and a portion of the fine alumina particles included in the coating liquid corresponds to 60%-90%. When the rate of the fine alumina particles is high for increasing heat releasing effect, a flaking phenomenon occurs to decrease adhesive strength of the coating liquid. That is, when the portion of the fine alumina particles is under 60%, the heat is not easily released and when the portion of the fine alumina particles exceeds 90%, the adhesive strength decreases.

In examples, the thermal conductivity of the coating liquid is chosen according to a size and a quantity of the fine alumina particles. In one example, the proper heat conductivity corresponds to 1.0 W/mK-5.0 W/mK.

For example, the liquefied coating liquid includes an adhesive reinforcing agent for increasing an adhesive strength of the liquefied coating liquid. Also, the liquefied coating liquid is added to the curing agent for decreasing the curing time required for it to be formed.

A temperature reducing effect of the heat releasing layer 160 is chosen according to a specified coating area and a coating thickness of the heat releasing layer 160. However, when the area of the heat releasing layer 160 exceeds a first standard value, the area of the heat releasing layer 160 benefits from being properly controlled because otherwise performing a fault check of the heat releasing semiconductor package 100 is difficult. Also, when the thickness of the heat releasing layer 160 exceeds a second standard value, the thickness of the heat releasing layer 160 benefits from being properly controlled because otherwise the tape of the heat releasing semiconductor package 100 required in the manufacturing process droops. Considering the factors mentioned above, in an example the area of the heat releasing layer 160 corresponds to 6-7 mm by 22-25 mm. In examples, the area of the heat releasing layer 160 is smaller than a punch standard because the area is possibly limited by the punch standard. Here, the punch refers to a method that marks an area for removing the semiconductor chip 10 attached on the insulating film 110 when the heat releasing semiconductor package chip 100 is a defective product. For example, the area of the heat releasing layer 160 is formed as a coat within the punch area because the defective semiconductor package chip 100 is removed by the punch area.

In an example, the thickness of the heat releasing layer 160 corresponds to 0.5 mm-3.0 mm. When the thickness of the heat releasing layer 160 is thicker, the heat releasing effect increases because the thickness of the heat releasing layer 160 is proportional to its heat releasing effect. However, when the thickness of the heat releasing layer 160 is thicker than 3.0 mm, the heat releasing effect potentially saturates, and does not increase.

Therefore, in an example, the area of the heat releasing layer 160 corresponds to a range of 5 mm-10 mm by 10 mm-40 mm and the thickness of the area of the heat releasing layer 160 corresponds to a range of 0.5 mm-3.0 mm.

Figure 2:
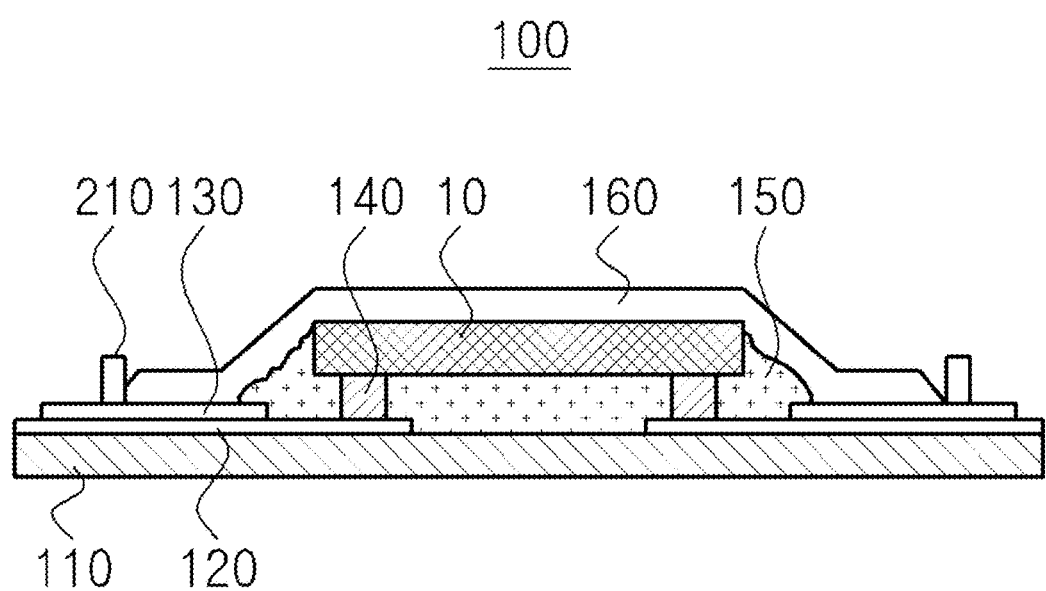
FIG. 2 is a side view diagram illustrating a heat releasing semiconductor chip package, according to another example.

FIG. 2 is a side view diagram illustrating a heat releasing semiconductor chip package according to another example.

In FIG. 2, a guide bar 210 refers to an edge of a preformed heat releasing layer. For example, the guide bar 210 is formed on the solder resist 130. In this example, the guide bar 210 supports a pattern formation of the heat releasing layer 160, so the heat releasing layer 160 is evenly coated. In one example, the guide bar 210 is implemented as an injection nozzle.

A viscosity of the guide bar 210 is higher than a viscosity of the heat releasing layer 160 or is substantially same as the viscosity of the heat releasing layer 160. The guide bar 210 has such a viscosity because the guide bar 210 is formed before the coating of the heat releasing layer 160 so that the guide bar 210 is coagulated first. Therefore, the guide bar 210 guides the heat releasing layer 160 so the coated heat releasing layer 160 does not flow to the side. Therefore, the guide bar 210 guides the heat releasing layer 160 so the area of the heat releasing layer 160 is properly formed.

FIGS. 3A-3D are diagrams illustrating a process for manufacturing the heat releasing semiconductor chip package.

Figure 3A:
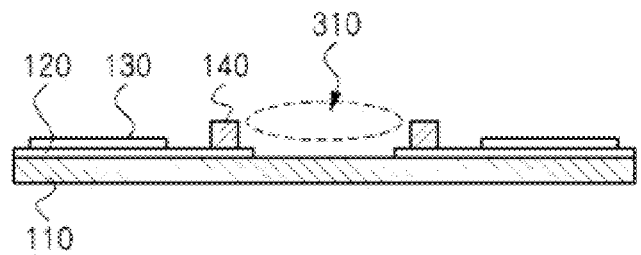
FIGS. 3A-3D are diagrams illustrating a process for manufacturing the heat releasing semiconductor chip package.

In FIG. 3A, the metal pattern 120 and the solder resist 130 are sequentially formed on the insulating film 110. In this example, a part of the sequentially formed solder resist 130 is removed so the semiconductor receiving area 310 is formed.

The plurality of bumps 140 are formed on the metal pattern 120 based on the semiconductor receiving area 310. For example, the metal pattern 120 is deposited on the insulating film 110 and the part of the metal pattern 120 is removed so the semiconductor receiving area 310 is formed. In this example, the metal pattern 120 is removed by the etching process using the photo etching process, such as photochemical machining.

Figure 3B:
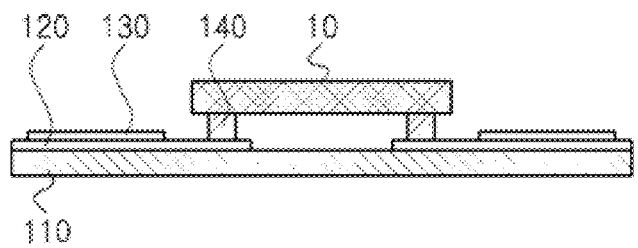

In FIG. 3B, the semiconductor chip 10 is positioned on the plurality of bumps 140. That is, the semiconductor chip 10 is electrically coupled to the metal pattern 120 through the plurality of bumps 140.

Figure 3C:
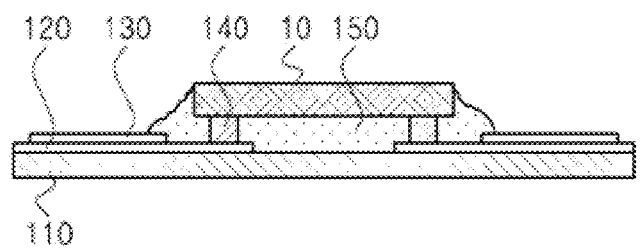

In FIG. 3C, the epoxy molding compound 150 is underfilled or coated to the semiconductor chip 10. For example, an apparatus used during underfilling is implemented as in substantially the same form as the injection nozzle, not illustrated, and the injection nozzle is used when the heat releasing layer 160 is formed. Herein, an inlet size of the injection nozzle fitted to underfill corresponds to 16-17 mm. In examples, a quantity of the epoxy molding compound 150 used during underfilling corresponds to a range of 2 mg-10 mg. In an example, to cure the epoxy molding compound 150, the pre-curing is performed during 10-20 minutes after the underfilling of the epoxy molding compound 150. In this example, post-curing is performed during 3-4 hours using an oven after pre-curing. Post-curing is performed over a longer time period than pre-curing so that a bottom of the semiconductor chip 10 is sealed from moisture or air from the outside.

Figure 3D:
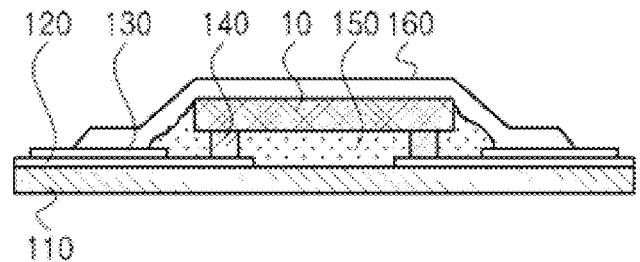

FIG. 3D is a diagram illustrating a process of forming the heat releasing layer 160 after the underfilling process. The heat releasing layer 160 is formed by coating and curing of the coating liquid.

In this example, the coating liquid includes the fine alumina particles and the heat releasing molding compound to be formed. The liquefied coating liquid is injected on the semiconductor chip 10 using the injection nozzle so that the liquefied coating liquid is in directly contact with the semiconductor chip 10. The coating layer 160 is formed by the injected coating liquid. Such a coating process corresponds to a package process of directly injecting the coating liquid through the injection nozzle, not illustrated, to cure the second surface of the semiconductor chip 10. In detail, the coating layer 160 is patterned to have a rectangular form by the liquefied injection nozzle, and is formed by a method of injecting the coating liquid to a patterned interior. In one example, a patterning form is formed to have a rectangular form or oval form. In one example, the coating liquid is injected in a single direction or a zigzag direction with respect to the patterned interior. In an example, a quantity of the injected coating liquid corresponds to about 100 mg-400 mg.

Thus, the coating layer 160 is formed by the coating process and the formed coating layer 160 is cured for forming the heat releasing layer 160. Thus, the coating layer 160 is formed using the proper curing temperature and curing time, as discussed above, because the curing temperature and the curing time affect a heat releasing property of the heat releasing layer 160. For example, curing the coating layer 160 includes performing pre-curing and post-curing. The formed coating layer 160 forms the heat releasing layer 160 by sequentially performing pre-curing and post-curing.

Pre-curing may sequentially perform curing during 5-20 minutes after the coating process of the coating layer 160, because pre-curing performs a first curing of the coating layer 160. Pre-curing the coating layer 160 corresponds to a process of maintaining the adhesive strength of the coating layer 160 and of forming the proper area of the heat releasing layer 160. In an example, a temperature for curing the coating layer 160 in pre-curing falls in the range of 100° C.-200° C.

Post-curing corresponds to a process of a final curing of the coating layer 160. For example, post-curing corresponds to a process of curing the coating layer 160 for increasing the adhesive strength of the heat releasing layer 160. Post-curing corresponds to a bake process and in an example is performed in the oven. In one example, a temperature for post-curing the coating layer 160 falls in the range of 100° C.-200° C. and a time for post-curing falls in the range of 1-3 hours.

Figure 4:
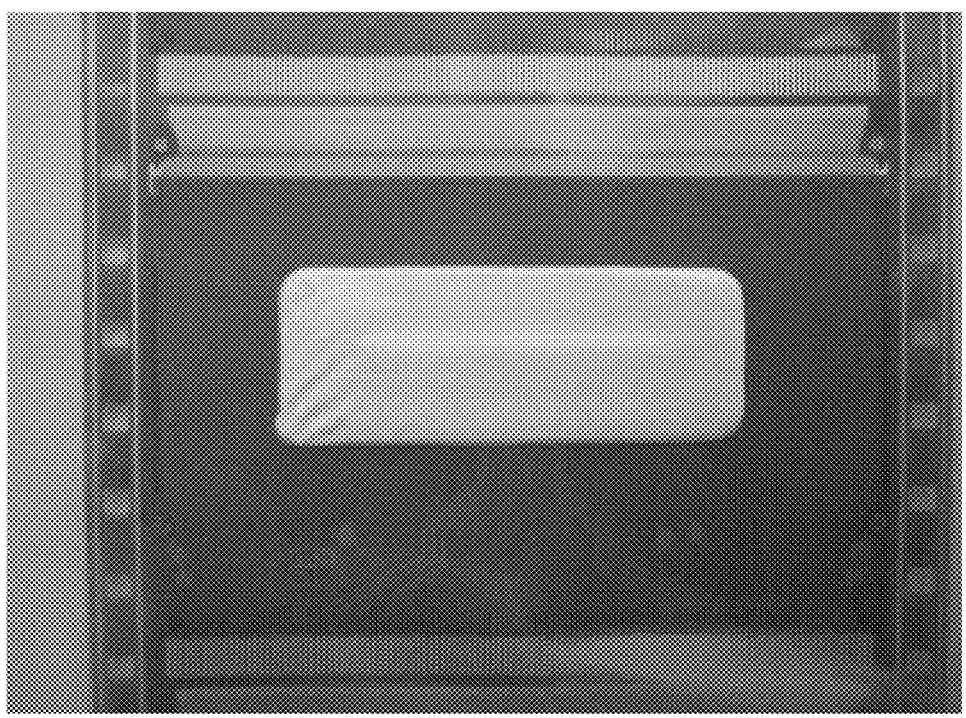
FIG. 4 is a picture illustrating a sample semiconductor chip package manufactured by a method for manufacturing the heat releasing semiconductor chip package.

FIG. 4 depicts a COF packaging sample diagram including the heat releasing layer 160 on the semiconductor chip 10. Herein, a layer showed in white corresponds to the heat releasing layer 160. In this example, the heat releasing layer 160 fully covers the semiconductor chip 10 and is formed so that the heat generated in the semiconductor chip 10 is released through the heat releasing layer 160.

Figure 5:
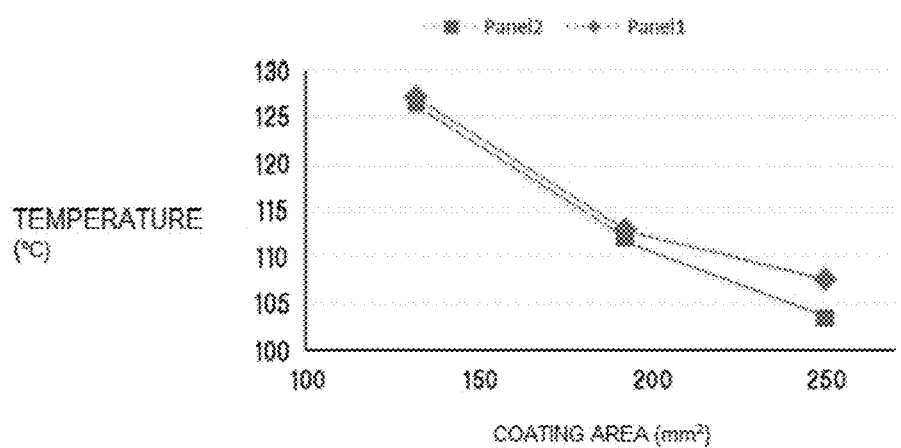
FIG. 5 is a graph illustrating a temperature reducing effect according to an area of a heat releasing layer in the heat releasing semiconductor chip package.

FIG. 5 is a graph illustrating a heat releasing effect according to the coating area of the coating layer. In FIG. 5, the larger the coating area of the coating layer 160, the more the heat releasing effect increases.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for manufacturing a heat releasing semiconductor chip package, the method comprising:
   attaching a first surface of a semiconductor chip onto an insulating film, wherein an epoxy molding compound is filled into a space between the insulating film and the semiconductor chip;
   injecting a coating liquid comprising a liquefied heat releasing molding compound and fine alumina particles onto a second surface of the semiconductor chip to form a liquefied coating layer; and
   curing the liquefied coating layer to form a heat releasing layer,
   wherein the liquefied heat releasing molding compound is a mixture formed by mixing a liquefied silica colloid with a silicone rubber or a silicone resin.

2. The method of claim 1, wherein the curing the liquefied coating layer comprises performing a pre-curing and performing a post-curing.

3. The method of claim 1, wherein filling the space with the epoxy molding compound further comprises performing a pre-curing for curing the epoxy molding compound and performing a post-curing for curing the epoxy molding compound.

4. The method of claim 3, wherein the performing the post-curing comprises curing the epoxy molding compound at a temperature of 100° C.-200° C.

5. The method of claim 2, wherein the performing the post-curing comprises curing the liquefied coating layer at a temperature of 100° C.-200° C.

6. The method of claim 1, wherein a viscosity of the coating liquid is 10,000 cP-300,000 Cp.

7. The method of claim 1, wherein a thermal conductivity of the coating liquid is 1.0 W/mK-4.0 W/mK.

8. The method of claim 1, wherein the liquefied heat releasing molding compound is a silicon-based molding compound.

9. The method of claim 1, wherein a size of the fine alumina particles is 3 μm-70 μm.

10. The method of claim 1, wherein an area of the heat releasing layer is 5 mm-10 mm by 10 mm-40 mm and a thickness of the heat releasing layer is to 0.5-3.0 mm.

11. A method for manufacturing a heat releasing semiconductor chip package, the method comprising:
    attaching a first portion of a lower surface of a semiconductor chip onto an insulating film;
    filling a space between the insulating film and the semiconductor chip with an epoxy molding compound to abut a second portion of the lower surface and side surfaces of the semiconductor chip;
    preparing a coating liquid comprising a mixture of a liquefied heat releasing molding compound and alumina particles;
    injecting the coating liquid onto an upper surface of the semiconductor chip to form a liquefied coating layer; and
    curing the liquefied coating layer to form a heat releasing layer,
    wherein the liquefied heat releasing molding compound is a mixture formed by mixing a liquefied silica colloid with a silicone rubber or a silicone resin, and
    wherein an area of the heat releasing layer is formed within an area of a punch which marks an area for removing the semiconductor chip attached onto the insulating film when the heat releasing semiconductor chip package is defective.

12. The method of claim 11, wherein the injecting the coating liquid further comprises forming a guide bar before the liquefied coating layer is formed.

* * * * *